(12) United States Patent
Razon

(10) Patent No.: US 7,032,311 B2
(45) Date of Patent: Apr. 25, 2006

(54) STABILIZED WIRE BONDED ELECTRICAL CONNECTIONS AND METHOD OF MAKING SAME

(76) Inventor: Eli Razon, 1478 Dillon Rd., Maple Glen, PA (US) 19002

( * ) Notice: Subject to any disclaimer, the term of this patent is extended or adjusted under 35 U.S.C. 154(b) by 529 days.

(21) Appl. No.: 10/179,560

(22) Filed: Jun. 25, 2002

(65) Prior Publication Data

US 2003/0234451 A1    Dec. 25, 2003

(51) Int. Cl.
*H01B 19/00*    (2006.01)
(52) U.S. Cl. .................... 29/879; 29/843; 29/874; 29/876
(58) Field of Classification Search ............ 29/825, 29/843, 842, 874, 876, 879; 228/4.5, 180.21, 228/180.22, 180.5
See application file for complete search history.

(56) References Cited

U.S. PATENT DOCUMENTS

| | | | | |
|---|---|---|---|---|
| 3,623,649 | A | * | 11/1971 | Keisling .................... 228/15.1 |
| 4,327,860 | A | * | 5/1982 | Kirshenboin et al. ..... 228/180.5 |
| 4,955,523 | A | * | 9/1990 | Carlommagno et al. . 228/180.5 |
| 5,156,323 | A | * | 10/1992 | Kumazawa et al. ..... 228/180.5 |
| 5,299,939 | A | * | 4/1994 | Walker et al. ................ 439/74 |
| 5,476,211 | A | * | 12/1995 | Khandros ................ 228/180.5 |
| 6,049,976 | A | | 4/2000 | Khandros .................... 29/843 |

OTHER PUBLICATIONS

Spheres, Springs, Columns And Beams by Glenn Rinne Pub. in Advanced Packaging, Jul. 2001 @ 69- 71.

* cited by examiner

*Primary Examiner*—Carl J. Arbes
(74) *Attorney, Agent, or Firm*—John B. Sowell-Aty

(57) ABSTRACT

A new and improved electrical connector is provided for Ball Grid Array (BGA) devices and Direct Chip Attach (DCA) devices that solves the prior art problems of mismatch in the coefficient of thermal between a semiconductor die and its substrate, PC board or carrier. The electrical connector consists of a resilient loop of wire that is permanently wire bonded at a first and a second bond position to an electrode or contact pad of a die or an interposer. The closed loop of wire is stable in the X and Y direction and resilient in the Z direction which enables the wire bonded die or interposer to be temporarily attached to a carrier or test board for all forms of tests as well as being removable and reworkable even after being permanently soldered in place on a substrate or PC board. Since the loop shaped connectors are resilient in X, Y and Z directions, the die or interposer may be clamped onto a PC board or substrate to provide a lead free electrical connection that does not require any underfill. The loop size may be made with highly conductive and/or plated (coated) wire in sizes from about 2.5 mils diameter up to about 30 mils using wire having a diameter of about 1.0 mils up to 5.0 mils to replace prior art balls used on pads of about 3 mils size or greater.

13 Claims, 9 Drawing Sheets

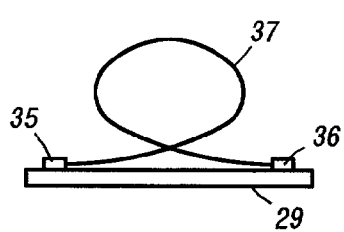
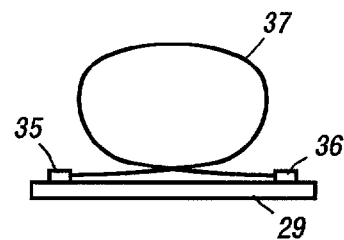
Figure 16  Figure 17
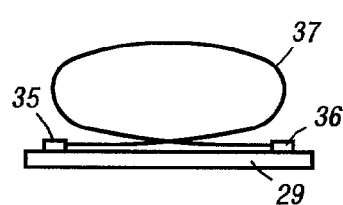
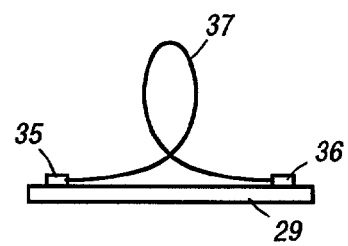
Figure 18  Figure 19
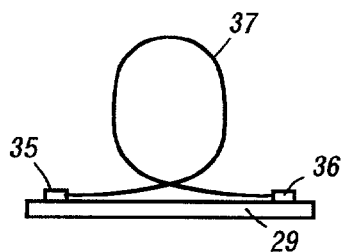
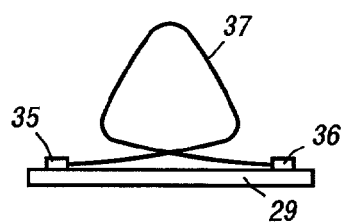
Figure 20  Figure 21
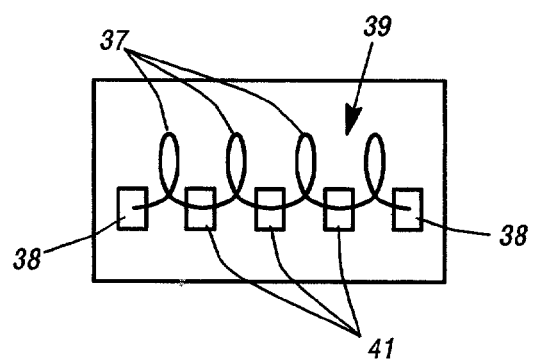
Figure 22

STABILIZED WIRE BONDED ELECTRICAL CONNECTIONS AND METHOD OF MAKING SAME

BACKGROUND OF THE INVENTION

1. Field of the Invention

The present invention relates to flexible electrical connectors that are permanently bonded onto contact pads of semiconductor devices and to a method of making stabilized closed configuration connectors with an automatic wedge wire bonder. More particularly, the present invention provides a reworkable flexible connection that may be configured to different shapes when bonded to electrical contact pads of a semiconductor device using only one bonding step.

2. Description of the Prior Art

Most semiconductor devices are provided with lead-out pads or electrical contact pads which are intended to be connected to packages, lead frames, circuit boards, substrates and various forms of carriers. It is well known in the semiconductor packaging art that the coefficient of thermal expansion of the semiconductor device is seldom if ever matched to the carrier or the substrate to which it is to be attached. To compensate for this difference in thermal expansion and to avoid breaks in connections and disconnections which often occur after passing testing operations, it has been common practice to use flexible conductive connectors which extend outward and downward from the semiconductor device. Semiconductor devices that are wire bonded to a substrate, lead frame, or carriers with flexible wire connections are almost impossible to rework should one of the many wire bond connections prove to be faulty after the semiconductor device is wire bonded.

Some high density semiconductor die are provided with solder or gold bumps instead of the usual square or rectangular bonding pads. Devices in this category usually fall into a category of Ball Grid Array (BGA) and/or Direct Chip Attach (DCA) flip-chip devices so named because the device is placed balls down on the substrate or carrier that has a connection pattern matching the array of bumps or balls. A series of steps are needed and employed to make bumps or to place balls in sockets to complete BGA connections on the flip-chip semiconductor device or BGA devices. The same problems that exist with all flip-chip type devices still exist. That is, BGA and flip-chip devices are prone to failure because of the differential thermal expansion between the semiconductor device and the substrate or carrier to which it is connected. Further, should the semiconductor device or any one ball or bump connector fail after integration into or onto a circuit board, it is not feasible to salvage the device or the circuit board.

The unsolved prior art problems are well described in U.S. Pat. No. 6,049,976, which is incorporated herein by reference and includes the many prior art references cited in the patent. Most of the references are found in class 29/subclasses 842–844 et seq. and class 228/subclasses 45 et seq. enumerated in the field of search. Basically the U.S. Pat. No. 6,049,976 teaches a stem of bonded wire which is plated and/or coated to form protrusions or connectors. Two forms of protrusions are described; one form is a spring and the other form a more rigid bump shape. The protrusions are made from layers of a metallic conductive material deposited or plated on free standing stems to provide a resilient or rigid protrusion. At least one embodiment teaches making tower like solder contacts (bumps) which define a final rigid shape even after multiple reflow steps.

Every stem or protrusion involves one or more process steps which follow the step of the bonding of the wire to produce an initial contact. The final spring like contact is moveable in a vertical and X-Y plane and cannot be reworked after being permanently soldered to a substrate or carrier.

An excellent summary of the problems associated with flip-chip packaging is found in the July 2001 issue of Advance Packaging at pages 67–71.

The present invention provides a novel solution to the decades old problem of the prior art in that the present invention resilient contacts can be made in one wire bonding step without subsequent processing steps and when rework is required the die, chip or device can be removed, repaired and reused as will explained in greater detail hereinafter.

It is highly desirable to provide a wire bonded chip or interposer which has all of the advantages of flip-chip devices and BGA devices and yet has none of the disadvantages described in the prior art patents and publications mentioned above.

SUMMARY OF THE INVENTION

It is a primary object of the present invention to provide a low cost and high yield connector for high density semiconductor devices that can be reworked after being made or integrated into a circuit board;

It is a primary object of the present invention to provide a novel resilient loop connector which eliminates the need for balls and bumps used in prior art flip-chip and BGA devices;

It is a primary object of the present invention to provide a low cost connector that is made by a single wire bonding step using an automatic wedge wire bonder and also solves the problem of thermal mismatch between an integrated circuit and its package, substrate, or printed circuit board;

It is a primary object of the present invention to provide a resilient connector for pads on a semiconductor device that may be made in one wire bonding step from a variety of metallic bonding wires including low cost, high conductivity copper and/or factory coated bonding wires.

It is a principal object of the present invention to provide a semiconductor device with resilient connectors made as the last assembly steps on previously tested and accepted semiconductor die.

It is a principal object of the present invention to provide a method and means for reworking semiconductor die with new connectors on any pad having a connector that was missing or tested as being faulty.

It is a primary object of the present invention to provide a semiconductor die with resilient connectors that are not affected by heat when removed from a faulty substrate or other forms of carrier connectors which may be reused without rework of the semiconductor die that has already passed all tests.

It is a primary object of the present invention to provide a method or means for making reliable low-cost connectors on small pads of the type now used on miniature semiconductor devices.

It is a primary object of the present invention to provide a method or means for making resilient connectors on semiconductor pads that are scalable in size.

It is a primary object of the present invention to provide a novel resilient connector on semiconductor pads that permits convection cooling of the semiconductor die and eliminates underfill of the type that prevents rework of the semiconductor device.

It is a general object of the present invention to provide a method and means for making variable size connectors on variable size pads of different semiconductors without the need of plural processing steps.

It is a general object of the present invention to eliminate the need for special process steps and process equipment and tooling used to make plural process built up connectors.

It is a principal object of the present invention to provide a novel package semiconductor device that may be tested as a package by connecting it to a test platform or to a PC board or a substrate without a permanent solder connection.

It is a principal object of the present invention to provide a novel wire bonded connector for semiconductor devices with resilient protrusions that permit burn in or other tests using pressure contact of the novel connectors to a test platform, It is a principal object of the present invention to provide a semiconductor device with resilient wire bonded connectors that permit interim and final testing before being permanently connected into a circuit board or substrates.

It is a general object of the present invention to provide a method of making miniature connectors and provide a means for making leadless connections to substrates and printed circuit boards.

It is a general object of the present invention to provide a method of making miniature inductive coils or inductors directly onto a circuit board or substrate or even on a semiconductor device.

According to these and other objects of the present invention a method of making novel close loop shaped resilient connectors on bonding pads of semiconductor devices is provided in which a first wire bond is made off center on a pad of a semiconductor device and the wedge bonding tool of an automatic wedge wire bonder is programmed to move in X, Y, Z and theta directions so as to form a reverse or closed loop in which the top of the loop is located in the approximate center of the bonding pad. Subsequently, a second wire bond is made off center in the same pad leaving an electrically conductive connector that is resilient in the Z direction and stable in the X and Y directions against minor forces, yet may be removed and remade on the same pad during rework.

BRIEF DESCRIPTION OF THE DRAWINGS

FIG. 16 is a schematic side view of one form of a closed loop;

FIG. 17 is a schematic side view of a near circular closed loop;

FIG. 18 is a schematic side view of a mashed or oval closed loop;

FIG. 19 is a schematic side view of an "1" or pin shape closed loop;

FIG. 20 is a schematic side view of an "1" or vertical oval shape closed loop;

FIG. 21 is a schematic side view of a triangular shape closed loop; and

FIG. 22 is a schematic plan view of a miniature inductor made by wire bonding a plurality of connected loops onto a semiconductor device or a PC board.

DESCRIPTION OF THE PREFERRED EMBODIMENTS

Figure 1:
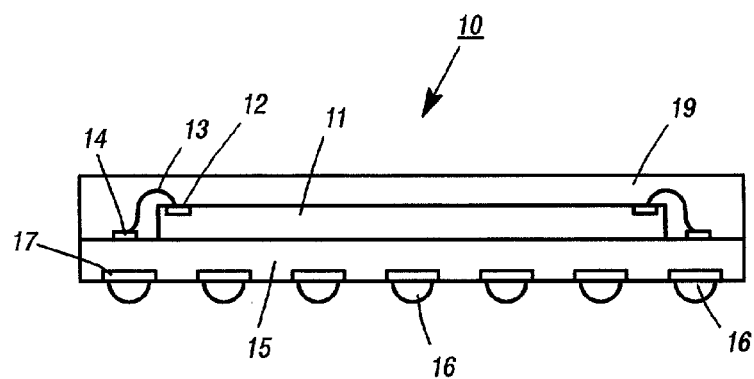
FIG. 1 is an elevation in section of a prior art Ball Grid Array (BGA) package showing a semiconductor die directly connected to a BGA interposer adapter having large balls or bumps for connection to a substrate.

Refer now to FIG. 1 showing an elevation in section of a prior art wire bonded BGA device 10. In this prior art embodiment, the active semiconductor device 11 is provided with bonding pads 12 on the upper active surface. Flexible wire bonds 13, usually gold wires, are made by automatic gold ball bonders, and connect the bonding pads 12 to the lead out pads 14 on the BGA interposer 15. The interposer 15 is a multi-layered device and provided with large balls 16 made on or provided in recess sockets 17 on the under side of the interposer 15. The large balls 16 of the interposer 15 form a matrix or array of conductive solder balls which may vary in size from 8 to 30 mils and match an identical array of conductive lead out pads on a carrier, substrate (not shown), such as a PC board 18. A non-hydroscopic cover of injected molded epoxy 19 is employed to encapsulate the device 11.

The interposer 15 serves a duel purpose. It is used to adapt numerous types of die to an identical array on a PC board 18 and in addition is employed as a fan out or distribution device from the die to the leads on a printed circuit board or substrate.

While this prior art solution eliminates the differential in thermal expansion between the device 11 and the PC board 18, it does not alleviate the stress in the large balls position between the interposer 15 and the PC board or carrier 18.

Usually the BGA interposer 15 is made in the form of a strip with five or more semiconductors 11 already wire bonded and encapsulated to the strip. The large balls 16 are formed on or placed in sockets 17 and reflowed by laser or a reflow oven. It is possible to inspect the individual devices 10 before or after reflow. If done before reflow, it is possible to detect missing balls which enable reworking the missing balls, however, if done after reflow there may have been missing balls or multiple balls stuck together which is very difficult to rework and often is marked for rejection after the devices are singulated. In a preferred sequence of steps only good tested semiconductor die 11 are wire bonded to good interposers 15, however, the process includes placing solder balls on or in every recess of every interposer on the strip being processed. After singulation, the good devices with the good interposers and the bad balls are usually scrapped. As will be explained hereinafter, the present invention eliminates the missing ball problem as well as the effect of the thermal mismatch.

The BGA package 10 in FIG. 1 has not eliminated the thermal mismatch! The device 10 creates heat into the top of the interposer which is designed to more nearly match the coefficient of expansion of the PC board or the substrate on which it will be mounted. However, because of the large temperature gradient that exists between the interposer and the PC board or substrate, very large thermal mismatch exists which equate to physical stresses. When large balls up to 30 mils are provided in large arrays, the solder balls themselves absorb horizontal shear stresses. When small balls around 8 mils in diameter are employed with highly heated semiconductor devices, it is necessary to inject an underfill layer which will be explained in greater detail hereinafter to alleviate shear stresses.

Figure 2:
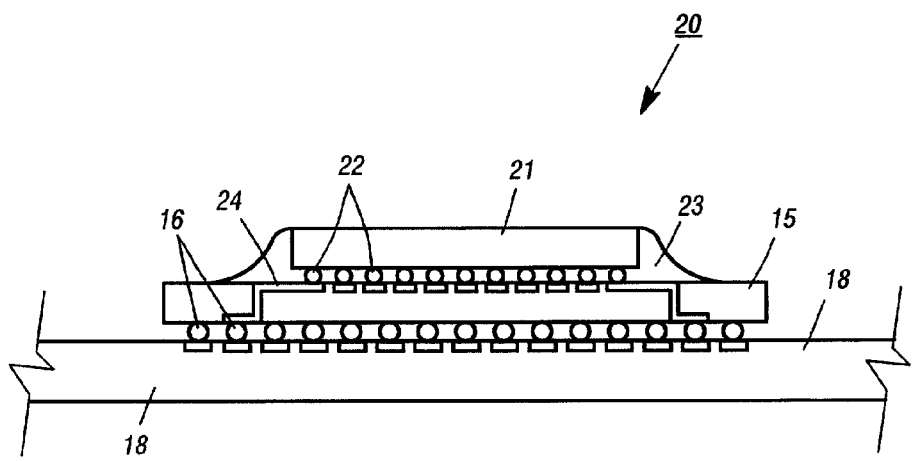
FIG. 2 is an elevation in section of a prior art BGA package showing a flip-chip semiconductor die with small solder balls connected to a BGA interposer adapter having large balls or bumps for connection to a substrate.

Refer now to FIG. 2 showing an elevation in section of another prior art BGA package 20 employing a flip-chip semiconductor die 21 with small balls 22 connected to a BGA interposer adapter 15 having large balls 16 adapted to connect to a PC board or substrate 18. This package 20 has a thermal mismatch between the silicon die 21 and the plastic organic material interposer 15. This package requires an underfill 23 to alleviate the shear stresses on the small balls 22. No second underfill is needed if the interposer 15 has balls 16 that are large enough to absorb the shear stress forces. Interposer distribution circuitry 24 is shown connecting the small balls 22 to the large balls 16.

Once the underfill 23 is inserted and hardened, the package cannot be reworked and if any fault is found the package is scrapped. The underfill 23 itself presents another problem. If the underfill 23 leaves voids and does not completely fill the space between the die 21 and the interposer 15, very high stresses build up. X-ray inspection is usually used to detect such voids as well as improper contacts between the balls and the adjacent die and/or interposer. However, such expensive inspection procedures, which include thermal cycling do not detect the problem, a computer or piece of expensive equipment is likely to fail in the field when being used and while under warranty. Further, there is an implied warranty that the equipment sold to a customer is fit for the use for which it was sold, thus, recalls and/or class action lawsuits usually follow behind the warranty periods.

Figure 3:
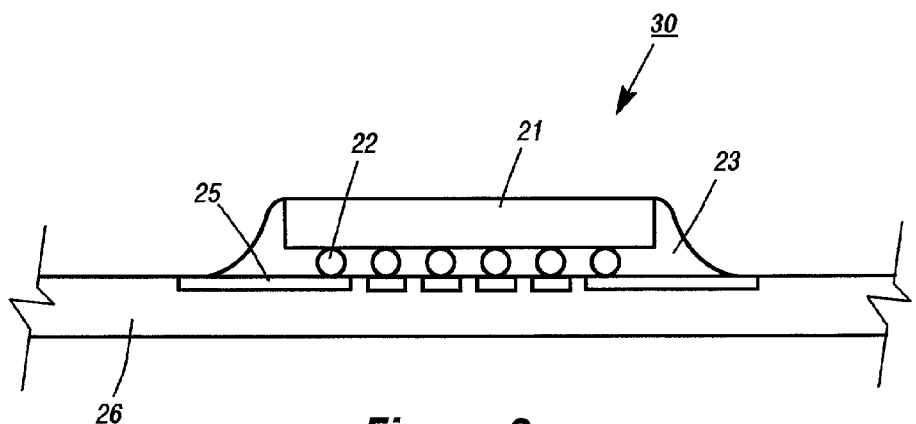
FIG. 3 is an elevation in section of another prior art flip-chip semiconductor die with small solder balls adapted for Direct Chip Attach (DCA) die to a substrate or printed circuit board (PC)

Refer now to FIG. 3 showing an elevation in section of a prior art flip-chip package 30 known in the art as Direct Chip Attach (DCA). This prior art package includes a flip-chip semiconductor device 21 with small balls 22 on the bottom surface in an array designed to directly attach to an identical array of lead out pads and circuitry 25 on a multi-layered PC board 26. There is a thermal mismatch as well as a difference in coefficient of thermal expansion between the die 21 and the PC board 26 that requires an underfill 23 to reduce the stresses on the small balls 22. As explained above, once the underfill is inserted and hardened should any one package of the plurality of packages placed on the PC board not pass final testing, the whole PC board and all die thereon cannot be reworked and this package needs to be scrapped. This is to say that good semiconductor die cannot be removed and reworked and used again when used with devices such as device 30.

IBM has produced a special design ceramic substrate to replace the PC board 26. The special ceramic substrate, while having a matched thermal coefficient of expansion with the die 21 will allow the elimination of the underfill 23, this solution is accompanied by extremely high costs of the multi-layered ceramic substrate 26. As presently informed the IBM modification has been limited to high end computing devices. This is to say that the ceramic substrates may have 32 to 48 layers and/or interposed conductive layers that becomes a problem in manufacture when making the substrates. The high cost of such substrates cannot compete with PC boards and substrates and plastic interposer adapters.

Figure 4:
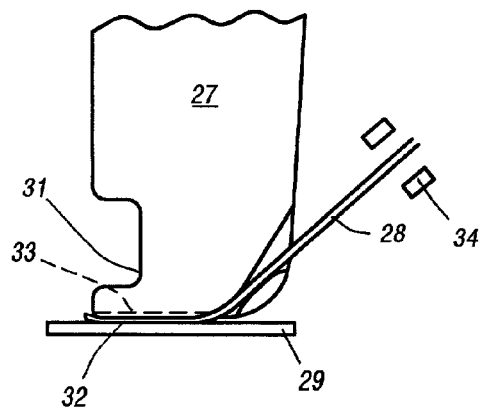
FIG. 4 is an enlarged partial side elevation view of a wedge bonding tool for making a first wire bond on an electrode or bonding pad of a semiconductor device.

Refer now to FIG. 4 showing an enlarged partial side view of a wedge bonding tool 27 used in a rotary head wire bonder such as a K&S Model 8060 for making ultrasonic first and second wire bonds on bonding pads or targets 29 using conductive fine wire 28. The wedge bonding tool 27 is adapted to fit a K&S 8060 rotary head wire bonder that has been modified to include a clearance notch 31 just above the bonding face 32 of the bonding wedge 27. The bonding wedge 27 is preferably provided with a groove 33 to capture the bonding wire 28 in the bonding face 32 of wedge 27. After the wedge 27 completes a first bond on the pad 29, the wedge 27 may be retracted and moved in the X, Y and Z direction to pay out a predetermined amount of wire 28 which will be used to make the novel loop that will now be described.

Figure 5:
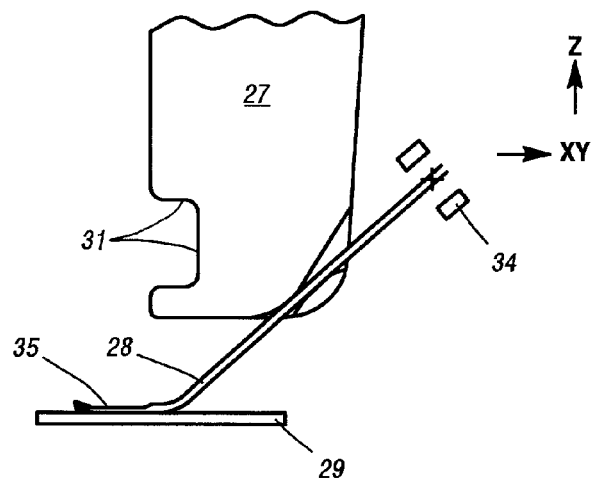
FIG. 5 is an enlarged partial side elevation view of a wedge bonding tool of FIG. 4 after moving in an X, Y and Z direction from the first bond.

Refer now to FIG. 5 showing the bonding wedge 27 after being moved to the new X, Y and Z position as shown so as to pay out a predetermined amount of wire 18 to be used in a loop to be described hereinafter. At the position shown in FIG. 5 the wire clamps 34 are preferably closed.

Figure 6:
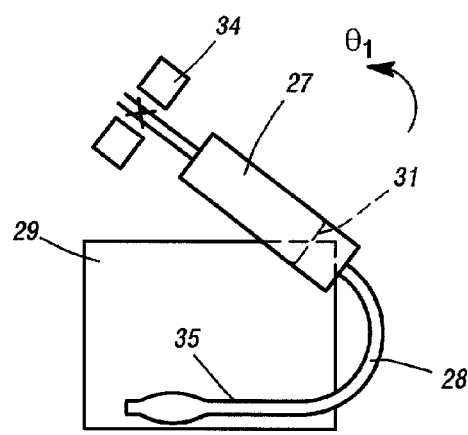
FIG. 6 is an enlarged plan view of the wedge bonding tool of FIG. 5 after being rotated counter-clockwise approximately 180 degrees to reverse the direction of the wire being bonded.

Refer now to FIG. 6 showing an enlarged plan view of the wedge bonding tool 27 after being rotated approximately 180 degrees in the counterclockwise direction while being offset from the first bond 35. It will be noted that the wire clamps 34 are still closed in the position shown in FIG. 6.

Figure 7:
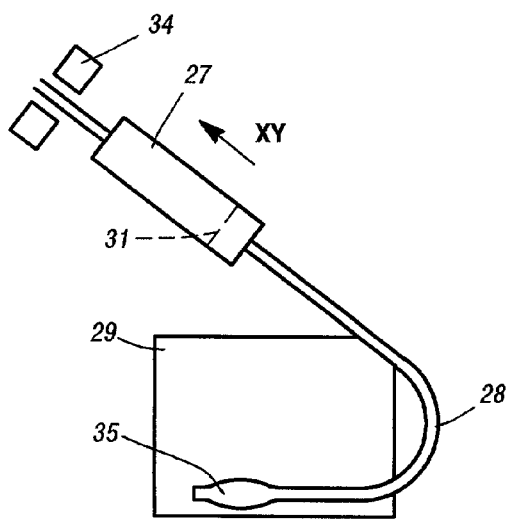
FIG. 7 is an enlarged plan view of the wedge bonding tool of FIG. 6 after moving in the X and Y directions to pay out a predetermined length of bonding wire.

Refer now to FIG. 7 showing an enlarged plan view of the wedge bonding tool 27 of FIG. 6 after being moved in an X and Y position with the wire clamps 34 now open to pay out an additional predetermined length of bonding wire 28.

Figure 8:
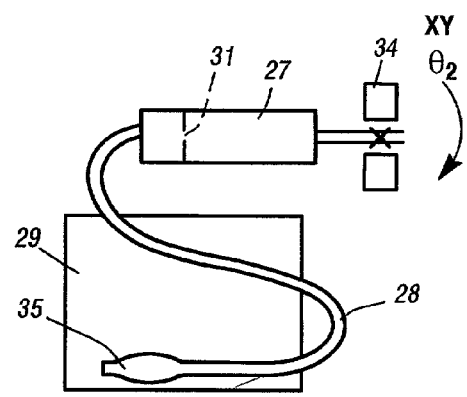
FIG. 8 is an enlarged plan view of the wedge bonding tool of FIG. 7 after being rotated clockwise approximately 180 degrees to form an "S"-shaped length of bonding wire to be formed as a closed loop.

Refer now to FIG. 8 showing an enlarged plan view of the wedge bonding tool of FIG. 7 after being moved and rotated clockwise approximately 180 degrees to form an "S"-shaped length of bonding wire 28 to be formed as a closed loop. The wire clamps 34 are still closed because the amount of wire in the closed loop has been completed to form a loop having a diameter of 3 to 30 ten-thousandths of an inch.

It will be noted that the bonding tool is preferably rotated at a position which is not directly above the bonding pad 29. The reason for bringing the bonding tool out away from the bonding pad 29 is to assure that the "S"-shaped length of wire is not crimped or damaged by the bonding tool 27 and in this respect the clearance notch 31 provides additional clearance before the tool 27 is moved downward in the Y direction over the bonding pad 29.

Figure 9:
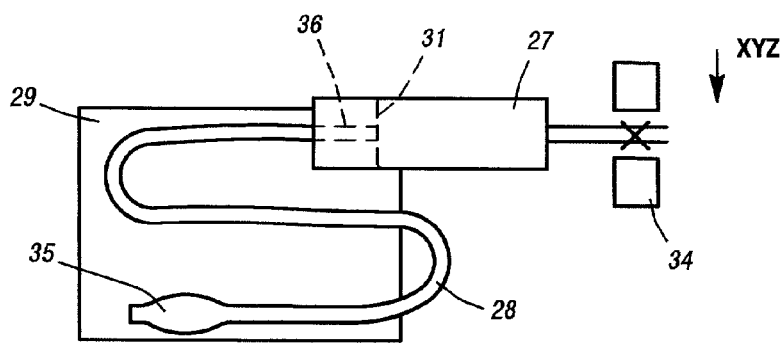
FIG. 9 is an enlarged plan view of the wedge bonding tool of FIG. 8 after being moved in an X, Y and Z direction and positioned on the same bonding pad at a second bond.

Refer now to FIG. 9 showing an enlarged plan view of the wedge bonding tool 27 of FIG. 8 after being moved in an X, Y and Z direction and positioned over the bonding pad at the second bond position. Note that the wire clamps 34 are still closed while the bonding face 32 of the bonding tool 27 is over the second bond position under the bonding face 32 of the bonding wedge 27.

Figure 10:
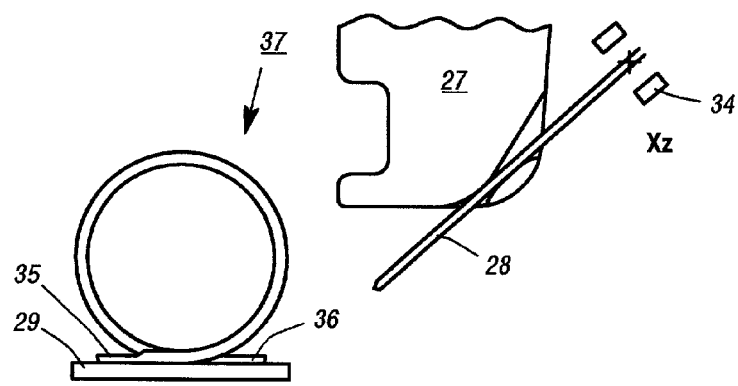
FIG. 10 is an enlarged plan view of the wedge bonding tool of FIGS. 4 to 9 after making a second wire bond on the bonding pad and moving up and away to sever the bonding wire at the second bond leaving a closed resilient loop of predetermined shape on the bonding pad.

Refer now to FIG. 10 showing an enlarged side view of the wedge bonding tool 27 of FIGS. 4 to 9 after making the second wire bond 36 on the bonding pad 29 and moving up and away with the wire clamps 34 closed so as to sever the bonding wire 28 at the second bond 36 and leaving a closed resilient loop 37 of predetermined shape on the bonding pad 29.

Figure 11:
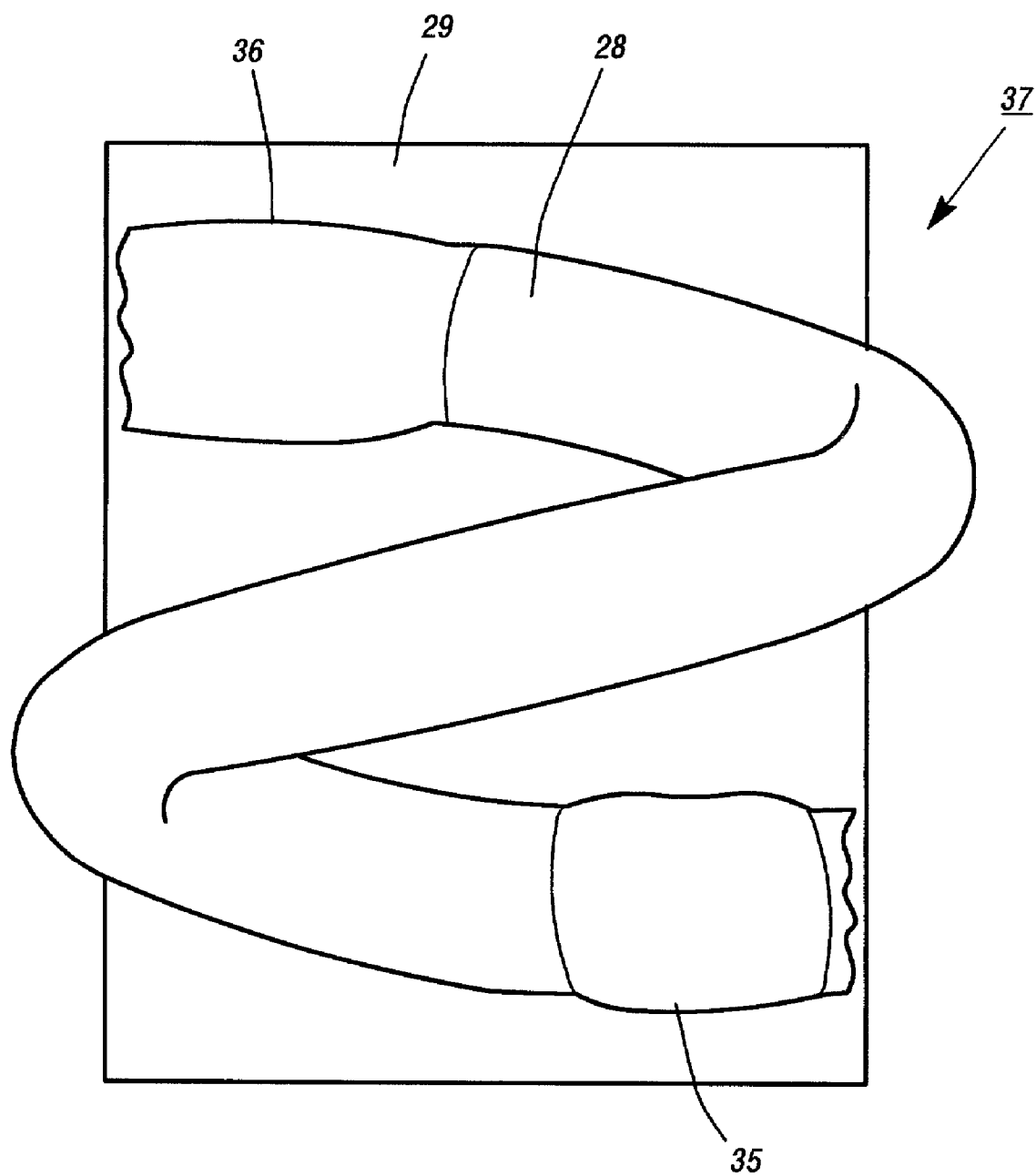
FIG. 11 is an enlarged plan view of a bonding wire after being bonded to a bonding pad of a semiconductor device showing a loop that is stable in the X and Y directions and yet resilient and conformable in the Z direction.
Figure 12:
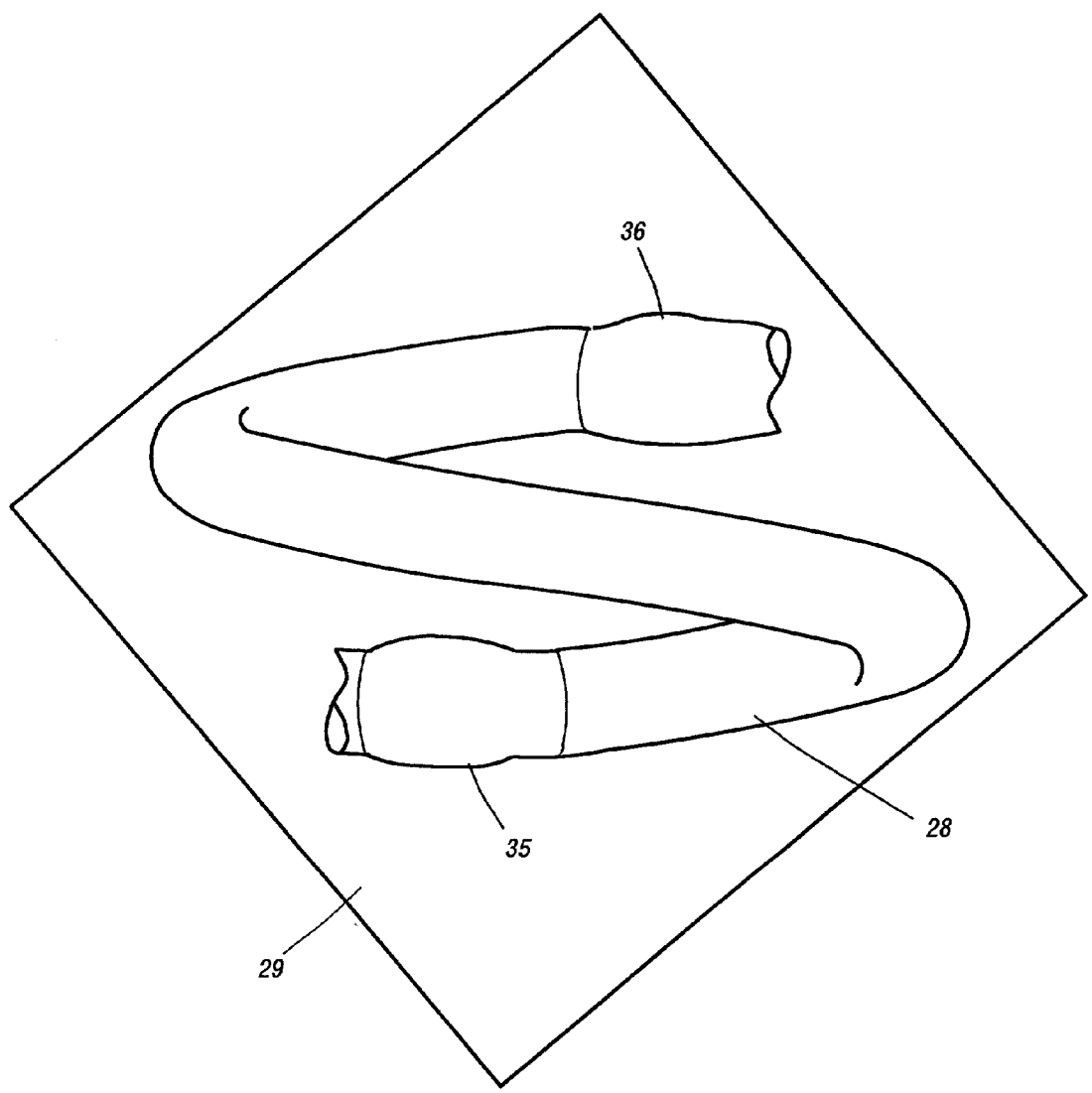
FIG. 12 is an enlarged plan view of another bonding wire after being bonded to a bonding pad showing the "S"-shaped closed loop rotated 45 degrees on the bonding pad for placing the loop inside the perimeter of the bonding pad.

Refer now to FIG. 11 showing an enlarged plan view of a bonding wire after being bonded to a bonding pad 29 to form a loop 37 that is stable in the X and Y directions and resilient or conformable in the Z direction. It is possible to make the loop 37 completely inside of a pad 29 which has a rectangular or square shape with a minimum size of 3 to 4 mils.

Figure 13:
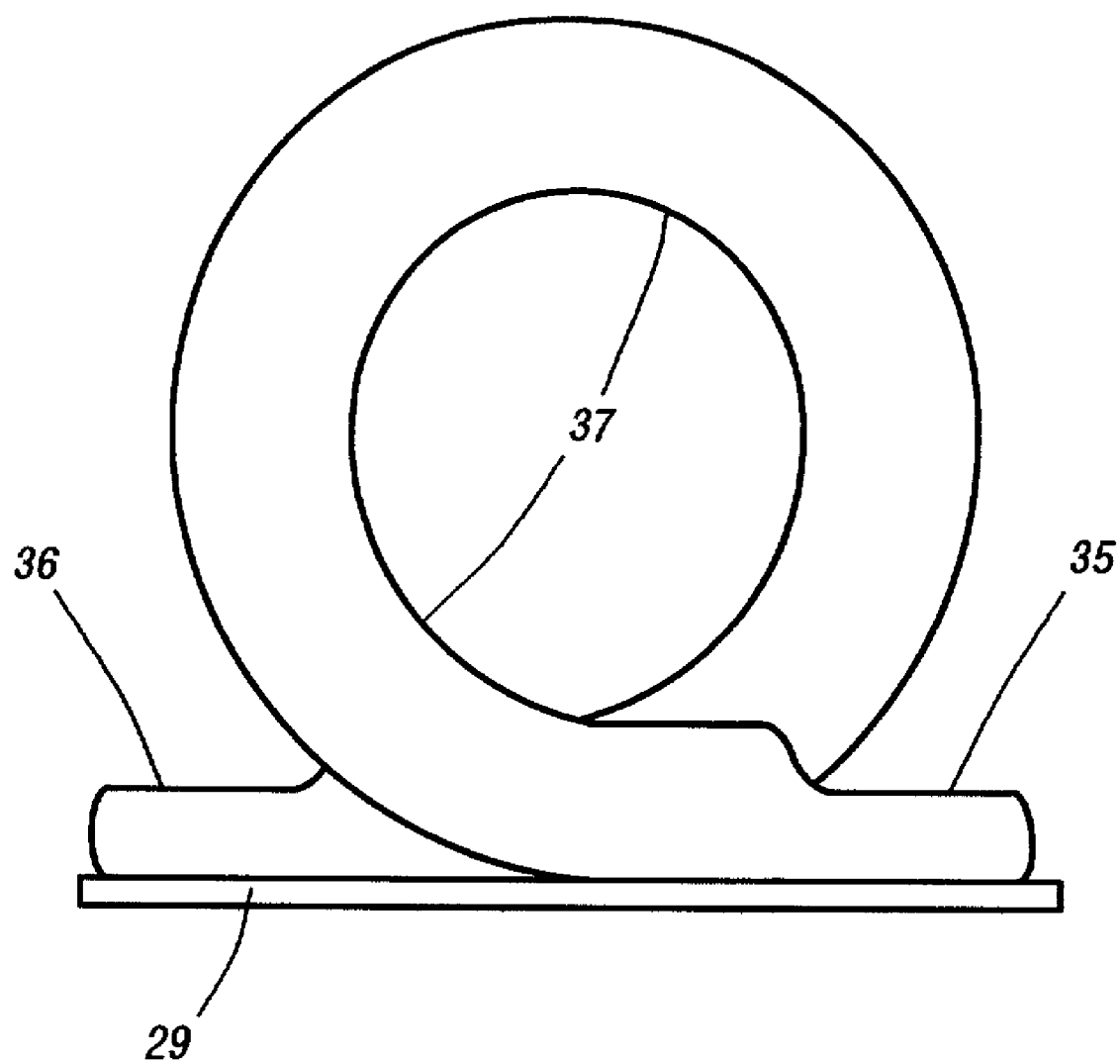
FIG. 13 is an enlarged side view of the circular loop made by bonding a bonding wire to a bonding pad as shown in FIGS. 11 and 12.

Refer now to FIG. 13 showing an enlarged side view of a circular loop 37 having first and second wire bonds 35 and 36 similar to those shown in FIG. 11. It will be noted that the two bonds 35 and 36 are well inside the perimeter of the bonding pad 29.

Figure 14:
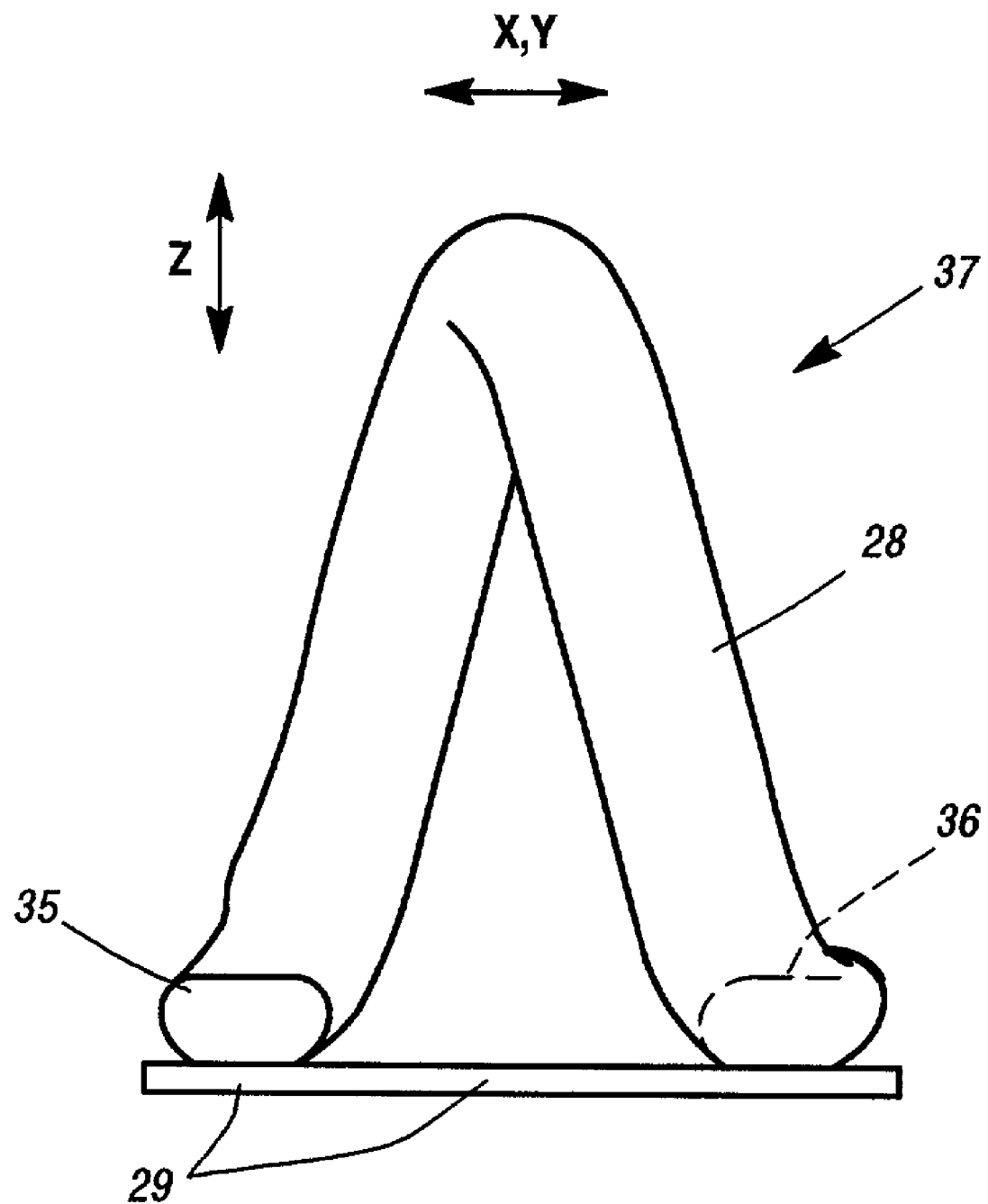
FIG. 14 is an enlarged end view of the circular loop of FIGS. 11 to 13.

Refer now to FIG. 14 showing an enlarged end view of the circular loop shown in FIG. 13 and is numbered the same.

Refer now to FIG. 14 showing an enlarged end view of the circular loop 37 shown in FIGS. 11 and 13. The numbers used in FIGS. 11 and 13 are the same as those used in FIG. 14 and do not require additional explanation. It should be noted that the novel loop 37 is resilient or compressible in the Z direction while maintaining a substantial stiffness or rigidity in the X and Y direction which is not the case of stem bonded wires.

Figure 15:
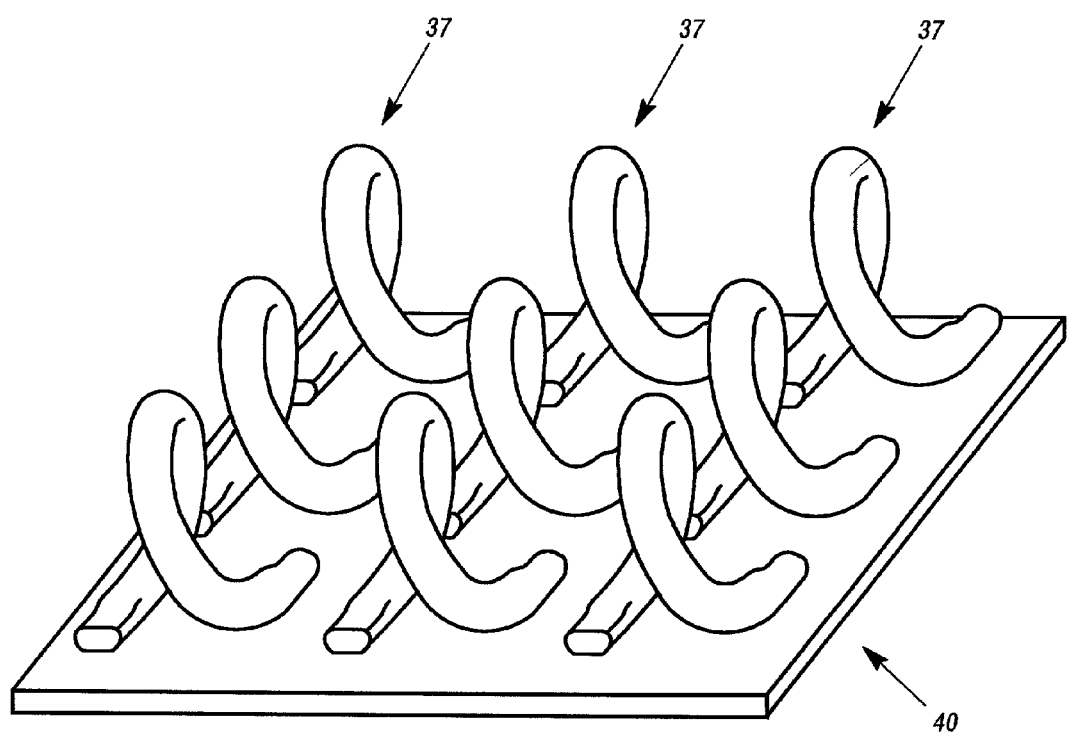
FIG. 15 is an isometric view of an enlarged array of circular loops closely spaced on bonding pads to illustrate how the novel loops may be substituted for balls on BGA devices.

Refer now to FIG. 15 showing an isometric view of an enlarged array of circular loops closely spaced on either bonding pads or used as a substitute for the balls on a BGA or DCA device or bonded to a substrate 40 which may be used as an interposer in FIGS. 1 and 2 showing die 11 and 21 and interposers 15.

Before explaining FIGS. 16 to 22 the inventor has discovered that different closed loop configurations may be programmed into programmable wedge wire bonders such as the K&S Model 8060, etc. Further, the definition of a closed loop is any and all of the wire bonded loops in the present application or modifications thereof. It is possible to create strong spring forces by choosing the different geometries as well as choosing different wire diameters as well as using different materials as well as using wires that are wire drawn having coatings thereon. In the preferred embodiment, copper wire may be used because it is available in alloy form which has a very strong spring tension and is a very good conductor, thus, reducing the cost of balls alone by a factor of ten and completely eliminating the need for interposers. Further, there is no need to throw away any device which has a faulty wire bond. It is known in the wire bonding art that millions of bonds may be made before a single faulty wire bond is detected. Even when a faulty wire is detected it may be removed and the same bonding pad used for a new loop such that the contact point of the loop is always the center of the pad. While copper wire is a preferred conductor because it is cheap it may be coated with a coating of gold, tin, lead, nickel, silver so that it does not oxidize before being placed in its final circuit environment. Any of these forms of coated wires may be wire drawn so as to provide a non-oxidation coating.

Refer now to FIG. 16 showing a schematic side view of one form of a closed loop in which the circular loop is raised above the bonding pad.

Refer now to FIG. 17 showing a circular loop where the legs or ends of the bonding wire 38 are substantially flat against the bonding pad 29.

Refer now to FIG. 18 showing a schematic side view of a mashed or oval closed loop 37.

Refer now to FIG. 19 showing a schematic side view of an "1" or pin shaped closed loop.

Refer now to FIG. 20 showing a schematic side view of an "1" or vertical oval shaped closed loop 37.

Refer now to FIG. 21 showing a schematic side view of a triangular or pin shaped closed loop 37.

Refer now to FIG. 22 showing a schematic plan view of a miniature inductor 39 made by forming miniature loops 37 on miniature isolation pads 38. The inductor 39 forms a complete circuit between the end conductor pads 38.

Having explained a preferred embodiment and several modifications of closed loops, it will be understood that almost any form of closed loop may be programmed into an automatic wire bonder which can produce approximately eight to ten loops per second on pads of a semiconductor device or interposer or directly onto a PC board or substrate.

The invention involves more than the replacement of a ball with a modified loop in that the wire bonded loop may be made from highly conductive copper wire or other plated wires and in the event of ever needing a replacement loop the loop may be removed and reworked or moved aside so that a proper loop can be made on the same bonding pad. However, once a solder ball is integrated into a printed circuit board or substrate it is almost impossible to remove the device having solder balls and rework the device without damaging other balls and creating other problems. In the case of the wire bonded loops the wire bond has a very high bonding temperature and threshold, thus, the device may be heated to a temperature which releases the loop from its PC board or substrate without causing any damage to the solder connection which does not exist on the die. This is to say that any of the loop devices may be removed from a solder environment on a substrate or PC board and reworked and replaced on another PC board or substrate. Further, it is possible to create a very strong resilient loop which may be clamped onto and pressed onto a PC board or substrate to make an adequate electrical connection without the need for any lead or solder type device. Thus, the present invention is a leadless connector in many applications.

What is claimed is:

1. A method of making resilient electrical connectors on bonding pads of semiconductors or BGA interposers comprising the steps of:
   providing a 180° rotary head wedge wire bonder with a predetermined type conductive wire,
   bonding the wire with a bonding wedge at a first bond on one of said bonding pads,
   raising the bonding wedge from said first bond while simultaneously paying out said wire and simultaneously rotating said rotary head about 180°, forming a predetermined reverse or closed loop shaped resilient member in said wire, bonding said wire at a second bond on a bonding pad so that a closed loop of conductive wire is bonded between said first and second bond, and breaking said wire at a second bond leaving one or more said closed loop shaped members ready for connection to a carrier or substrate.

2. The method as set forth in claim 1 wherein the step of bonding said conductive wire at a second bond comprises bonding the wire on the same bonding pad, whereby the loop shaped resilient member is formed on the same bonding pad to provide said electrical connector ready for use.

3. The method as set forth in claim 2 which further includes the step of repeating the steps of bonding and forming closed loop shaped members on pads of a flip-chip type semiconductor device to form a plurality of resilient closed loop shaped flip-chip connectors on the face of the semiconductor device being bonded.

4. The method as set forth in claim 3 wherein the conductive wire comprises bonding wire selected from a group consisting of gold, silver, copper, beryllium, nickel, and their alloys.

5. The method as set forth in claim 4 wherein said conductive wire comprises said bonding wire having a coating of a second conductive metal.

6. The method as set forth in claim 2 wherein the step of forming a predetermined reverse or closed loop shaped member comprises forming a closed loop resilient spring having a loop diameter of 3 to 30 ten-thousandths of an inch.

7. The method as set forth in claim 6 which further includes the step of testing the wire bonded semiconductor device comprising the steps of:

pressing said plurality of closed loop shaped members onto a mating array of conductive pads on a test board adapter without having to make a permanent connection to perform all types of tests and burn in.

8. A method of making re-silient electrical connectors on bonding pads of semiconductors or on BGA interposers comprising the steps of:

providing a rotary head wedge wire bonder with a predetermined type conductive wire, bonding the wire with a bonding wedge at a first bond on one of said bonding pads, raising the bonding wedge from said first bond while simultaneously paying out said wire and rotating said rotary head, forming a predetermined loop shaped resilient member in said wire, bonding said wire at a second bond on a bonding pad so that a loop of conductive wire is bonded between said first and second bond, said second bond comprising bonding the wire on the same bonding pad, whereby the loop shaped resilient member is formed on the same bonding paid to provide said electrical connector, said step of forming a predetermined loop comprising forming a closed loop resilient spring having a loop diameter of 3 to 30 ten thousandths of an inch, populating a substrate or PC board with one or more semiconductor devices and clamping the wire bonded devices onto the substrate or PC board without making a solder connection, reworking a substrate or PC board by:

removing a clamped wire bonded device without heat, and replacing the removed clamped wire bonded device with a substitute device.

9. The method as set forth in claim 8 wherein the steps of replacing the removed clamped wire bonded device with a substitute device comprises reworking the removed device and replacing the removed device on a substrate or a PC board after rework.

10. A method of making re-silient connectors on bonding pads of semiconductors or on BGA interposers comprising the steps of:

providing a rotary bead wedge wire bonder with a predetermined type conductive wire, bonding the wire with a bonding wedge at a first bond on one of said bonding pads, raising the bonding wedge from said first bond while simultaneously paying out said wire arid rotating said rotary head, forming a predetermined loop shaped resilient member in said wire, bonding said wire at a second bond on a bonding pad so that a loop of conductive wire is bonded between said first and second bond, repeating the steps of bonding and forming loop shaped members on pads of a flip-chip type semiconductor device to form a plurality of resilient loop shaped flip-chip connectors on the face of the semiconductor de vice being bonded, testing the flip-chip device at any stage of its use, removing the wire bonded device from its environment, repairing one or more loop shaped resilient members by removing the defective loop, and forming a new loop on a bonding pad.

11. A method of making lead free electrical connectors on bonding pads of a flip-chip semiconductor device or interposer comprising the steps of:

providing a wedge bonder with a capability of rotating the bonding wedge about 180° degrees between a first and a second bond, bonding each of a plurality of bonding pads with a bonding wire at a first and a second bond on the same bonding pad, moving the bonding wedge in an X, Y, Z and theta motion between said first and second bonds while, forming a predetermined loop shaped resilient member on each bonding pad, whereby said flip-chip device or interposer is provided with a miniature resilient connector on each pad that is electrically connectable by pressure contact to a matching target array, said interposer having small pads on one side for contacting small loops, and bonding large loops on the side opposite the small pads to provide an interposer adapter.

12. The method as set forth in claim 11 wherein said matching target array comprises a lead out pad or connector on a carrier or a substrate or PC board or an interposer.

13. A method as set forth in claim 11, wherein said wedge bonder is provided with a bonding wedge having a clearance notch above the bonding face of the bonding tool, and the step of moving said bonding wedge in the theta direction captures said bonding wire in said clearance notch.

* * * * *